United States Patent [19]

Miyagi

[11] Patent Number: 5,421,892
[45] Date of Patent: Jun. 6, 1995

[54] VERTICAL HEAT TREATING APPARATUS

[75] Inventor: Katsushin Miyagi, Sagamihara, Japan

[73] Assignees: Tokyo Electron Kabushiki Kaisha, Tokyo; Tokyo Electron Tohoku Kabushiki Kaisha, Easahi, both of Japan

[21] Appl. No.: 170,754

[22] Filed: Dec. 21, 1993

[30] Foreign Application Priority Data

Dec. 25, 1992 [JP] Japan ................... 4-358987

[51] Int. Cl.6 ............ C23C 16/00; F16J 15/40
[52] U.S. Cl. ................... 118/724; 118/730; 49/478.1; 277/80
[58] Field of Search ............ 118/724, 723 R, 730; 49/478.1; 277/22, 80

[56] References Cited

U.S. PATENT DOCUMENTS

| | | | |
|---|---|---|---|
| 4,304,411 | 12/1981 | Wilcock | 277/80 |
| 4,565,157 | 1/1986 | Brors et al. | 118/719 |
| 4,771,730 | 9/1988 | Tezuka | 118/723 |
| 4,911,812 | 3/1990 | Kudo | 204/192.32 |
| 4,949,783 | 8/1990 | Lakios | 165/80.1 |
| 5,016,567 | 5/1991 | Iwabuchi et al. | 118/733 |
| 5,030,476 | 7/1991 | Okamura | 427/39 |
| 5,217,560 | 6/1993 | Kurono | 156/345 |
| 5,324,540 | 6/1994 | Terada | 427/255.5 |

FOREIGN PATENT DOCUMENTS 51-119450 9/1976 Japan .
55-16528 5/1980 Japan .

*Primary Examiner*—R. Bruce Breneman
*Assistant Examiner*—Jeffrie R. Lund
*Attorney, Agent, or Firm*—Beveridge, DeGrandi, Weilacher & Young

[57] ABSTRACT

A vertical heat treating apparatus includes a cap body, which is movable up and down, for sealing a treatment vessel that holds objects to be treated. A rotary loading device is provided with a rotary shaft which extends into a through hole provided in the cap body, and a magnetic fluid seal member is provided around the rotary shaft. Heat-exchange media, such as water or ethylene glycol, is circulated within the rotary shaft, preferably to cool the rotary shaft. A temperature sensor may be provided in a housing for the rotary shaft, such that when the temperature exceeds a set temperature, the flow rate of the heat exchange medium is increased. Baffle plates may be provided above an upper surface of the cap body and opposed to the through-hole in the cap body. In one preferred embodiment of the invention, nitrogen gas is circulated through the through-hole in the cap body to prevent corrosive gas from contacting the shaft. Circumferential grooves are defined around the rotary shaft at locations where the heat exchange medium is admitted and discharged from the rotary shaft. Preferably, the heat exchange medium is circulated in the rotary shaft above and below the level of the magnetic seal.

20 Claims, 3 Drawing Sheets

VERTICAL HEAT TREATING APPARATUS

BACKGROUND OF THE INVENTION

This invention relates to a vertical beat treating apparatus.

Vertical beat treating apparatuses are known for homogeneously heat treating or thermally diffusing objects to be treated, e.g., semiconductor wafers, to form thin films on the surfaces of the semiconductor wafers.

In such vertical heat treating apparatuses, reaction gases, e.g., $NH_3$ and $SiH_2Cl_2$, are supplied into a reaction vessel which is sealed in an air-tight manner by a cap body, and the reaction vessel is heated up to, e.g., 800° C., by a heater disposed around the outer circumference thereof.

The reaction vessel is loaded with a boat holding semiconductor wafers for heat treatment (i.e., a wafer boat). For the formation of more homogenous SiN films on the surfaces of the wafers, the boat for heat treatment is supported by a rotary shaft which passes through the cap body and is turned by rotary motion of a motor connected to the rotary shaft.

But in the case where a rotation mechanism for the wafer boat for heat treatment is provided in a vertical heat treating device, a problem is encountered in that heat for heating the semiconductor wafers is concentrated on the rotation mechanism for turning the boat, and the rotary shaft thereby possesses a high temperature.

It is also a problem in the case where a magnetic seal member, for example, is used to prevent leakage of reaction gases from between the rotary portion of the rotation mechanism and the cap body, when the magnetic seal member has a temperature above 80° C., oil, for example, containing a magnetic seal material adversely evaporates, with the result that the magnetic seal member is thermally degraded in a rapid manner.

Furthermore, it is also a problem that reaction gases which have leaked through the through-hole in the cap body contact the rotary shaft at high temperatures and corrode it.

SUMMARY OF THE INVENTION

An object of this invention is to provide a vertical heat treating apparatus which is free from degradation of a magnetic seal member of a rotary loading means even when a rotary shaft connected to a boat for heat treatment is exposed to high temperatures. Another object of the invention is to prevent corrosion of the rotary shaft of a rotation mechanism.

This invention is characterized in that a rotary loading means is provided which includes a magnetic fluid seal member, wherein the rotary loading means is connected to a cap body of a treatment vessel for holding objects to be treated, and a cooling medium is circulated in the rotary shaft of the rotary loading means.

This invention is characterized in that a heat insulating cylinder for supporting a boat is supported by the rotary shaft.

This invention is characterized in that there is provided means for feeding an inert gas into a through-hole formed between the rotary shaft and the cap body.

This invention is characterized in that a cooling medium is circulated in the rotary shaft of the rotary loading means, such that heat from the rotary shaft is absorbed to lower a temperature of the rotary shaft.

This invention is characterized in that the heat insulating cylinder supporting the boat holding objects to be treated is supported by the rotary shaft with the cooling medium circulating therein, whereby high-temperature heat is concentrated on the rotary shaft and removed by the cooling medium.

This invention is characterized in that an inert gas is fed into the through-hole between the rotary shaft and the cap body, whereby the rotary shaft is kept from contact with treatment gases, such as corrosive gases, etc.

DETAILED DESCRIPTION OF THE PREFERRED EMBODIMENTS

One embodiment of this invention is a vertical heat treating apparatus. This embodiment will be explained with reference to FIGS. 1 to 3.

Figure 1:
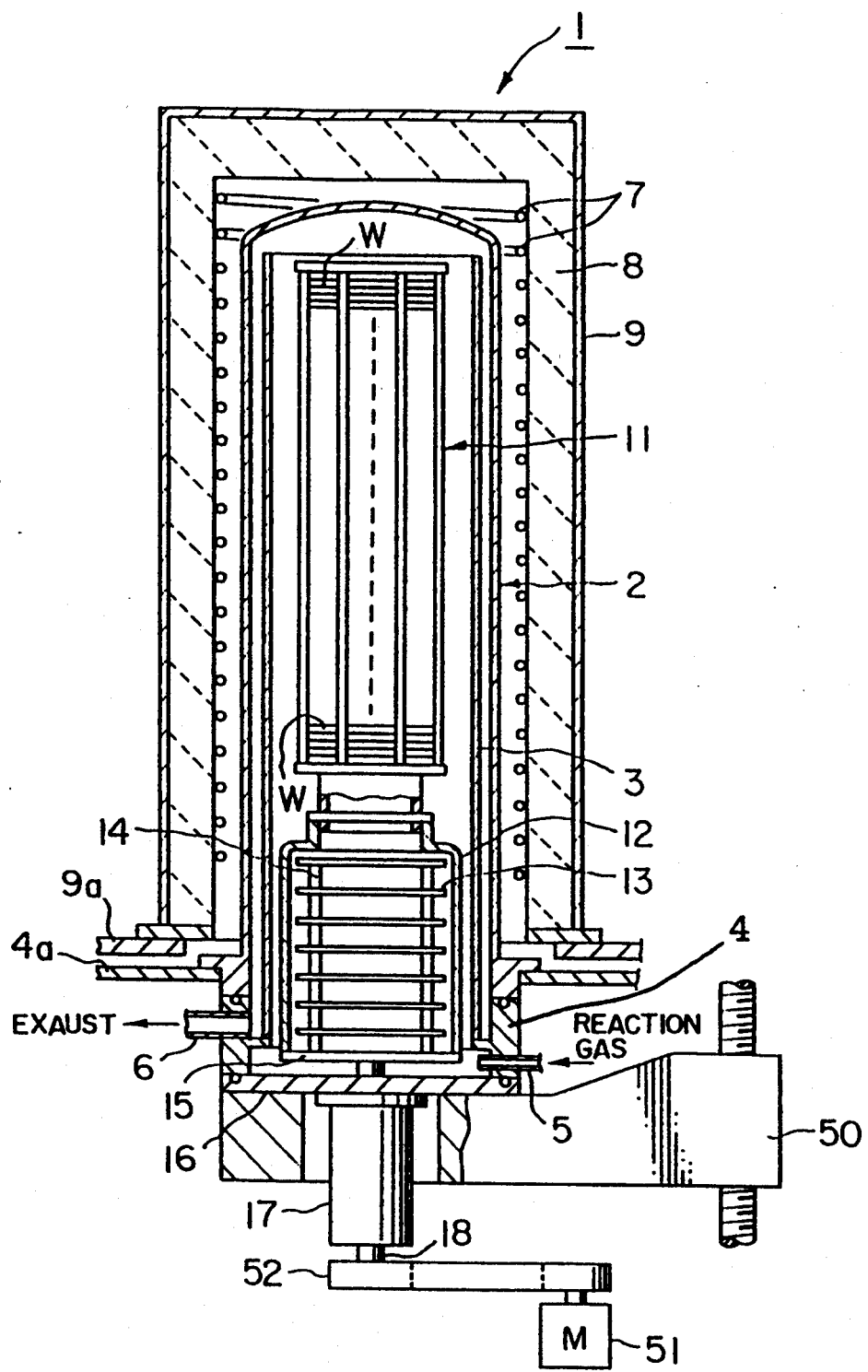
FIG. 1 is a vertical sectional view of the vertical heat treating apparatus according to this invention.

In a vertical heat treating apparatus 1 of FIG. 1, there is provided a cylindrical reaction vessel 2 of a heat resistant material, such as quartz. An inner tube 3 of a heat resistant material, e.g., quartz glass, is provided in the reaction vessel 2. A manifold 4 of, e.g., stainless steel, is provided for supporting the lower ends of the reaction vessel 2 and the inner tube 3. A gas feed pipe 5 connected to a gas supply source is provided in a side of the manifold 4, and an exhaust pipe 6 connected to a factory exhaust apparatus is provided in a side of the manifold 4.

A heater 7 in the shape of, e.g, a coil, is disposed conically around the outer circumference of the reaction vessel 2. A cylindrical outer shell 9 of, e.g., stainless steel, is provided around the outer circumference of the heater 7. The outer shell 9 is mounted on a frame 9a, and the reaction vessel 2 integrated with the manifold 4 is mounted on a frame 4a.

A quartz boat 11 of a heat resistant material, e.g., quartz glass, into which a plurality of objects, e.g., semiconductor wafers W (120 sheets), can be removably inserted is loaded into and unloaded from the reaction vessel 2. A heat insulating cylinder 12 of a heat resistant material, e.g., quartz glass, is provided on the lower end of the quartz boat 11. In the heat insulating cylinder 12, a plurality of quartz plates 13 of a heat resistant material, e.g., quartz glass, are removably mounted on support rods 14, spaced vertically from each other so that the heat insulation can be suitably adjusted. The support rods 14, and the heat insulating cylinder 12 have their respective lower ends supported by a base 15.

The cap body 16 provided below the lower end of the manifold 4 is lifted by a lift mechanism 50 into contact with the underside of the manifold 4 to seal the reaction vessel 2 in an air tight manner. Rotary loading means 17 is provided at the center of the underside of the cap body 16. At the center of the cap body 16, a rotary shaft 18 is provided, located at the center of the rotary loading means 17, which shaft 18 is passed through the cap body 16 and rotatably supports the base 15. The rotary shaft 18 is rotated by a motor 51 through a transmission mechanism 52.

The rotary loading means 17 will be explained in more detail with reference to FIG. 2.

Figure 2:
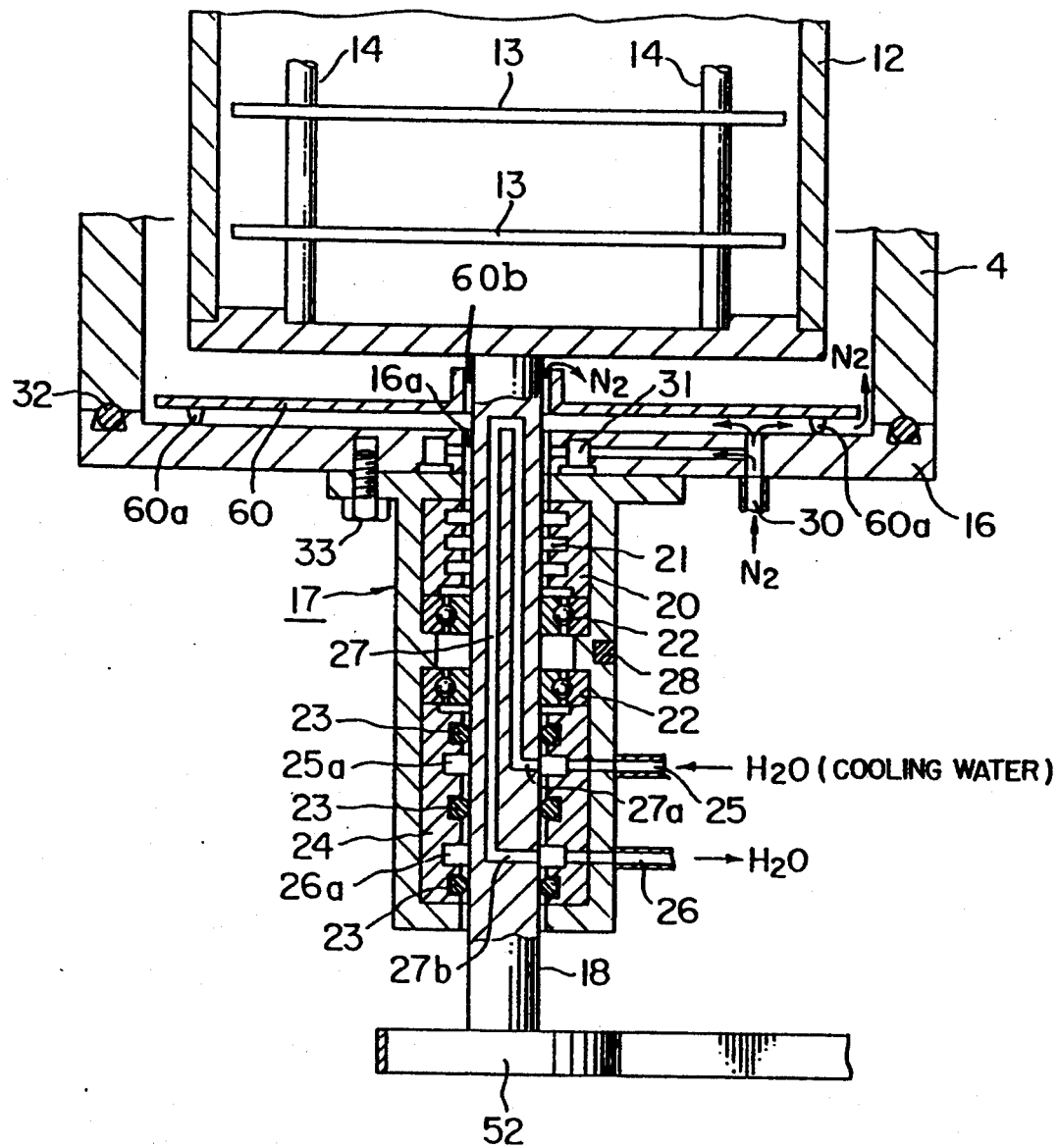
FIG. 2 is an enlarged vertical sectional view of the rotary loading means of the vertical heat treating apparatus.

As shown in FIG. 2, a magnetic seal 20 is provided around the rotary shaft 18 in an upper part of the interior of the rotary loading means 17, and oil 21 is held between the magnetic seal 20 and the rotary shaft 18 for air-tight sealing therebetween. At two central positions inside the rotary loading means 17, bearings 22 are provided for rotatably supporting the rotary shaft 18. The magnetic seal 20 functions as a vacuum seal.

Around the lower part of the rotary shaft 18 inside the rotary loading means 17, three O-rings 23 are provided, spaced apart equidistantly by a guide ring 24. A circumferential groove 25a is formed between the upper two O-rings 23. A cooling water inlet port 25 for allowing a cooling medium, e.g., cooling water, to enter the groove 25a is formed in a side of the rotary loading means 17. A circumferential groove 26a is formed between the lower two O-rings 23. A cooling water outlet port 26 for allowing the cooling medium, e.g., cooling water, to exit via the groove 26a is formed in a side of the rotary loading means 17. The O-rings 23 function as a water seal.

In the rotary shaft 18, a cooling water circulation passage 27 is provided which interconnects a horizontal hole 27a and a horizontal hole 27b. The horizontal hole 27a is provided for letting the cooling water into the shaft 18 via the circumferential groove 25a and the cooling water inlet port 25, and the horizontal hole 27b is provided for letting the cooling water out of the shaft 18 via the circumferential groove 26a. The circumferential groove 26a is connected to the cooling water outlet port 26. In this manner, the cooling water is circulated through the rotary shaft 18.

The cooling water circulating passage 27 is provided axially in the rotary shaft 18 so that at least the part thereof corresponding to the magnetic seal 20 can be cooled for effective absorption of heat conducted to the rotary shaft 18 from the heater 7.

A temperature sensor 28 for measuring a temperature inside the rotary loading means 17 is provided by, e.g., a thermocouple, which is disposed at a measuring position which has been preset in consideration of a temperature distribution, e.g., on a side of the rotary loading means 17.

A $N_2$ gas inlet port 30 is provided in the cap body 16 for allowing $N_2$ gas to enter therein. Annular gas feed portions 31 are provided for discharging $N_2$ gas to the outer circumference of the rotary shaft 18 via the through-hole 16a. The $N_2$ gas inlet port 30 and the annular gas feed portions 31 are connected to one another by a gas passage.

An O-ring 32 is provided on the upper surface of the cap body 16 for securing the cap body 16 to the manifold 4 in an air-tight manner when the cap body 16 is closed. The rotary loading means 17 is screw-fastened to the cap body 16. A baffle plate 60, having support portions 60a (e.g., at 3 locations) of quartz and a through-hole 60b with substantially the same diameter as the through-hole 16a, is mounted on the upper surface of the cap body 16. In place of the support portions 60a, a groove for admitting $N_2$ gas may be formed below the baffle plate 60.

Next a control system for the cooling water system will be explained with reference to FIG. 3.

Figure 3:
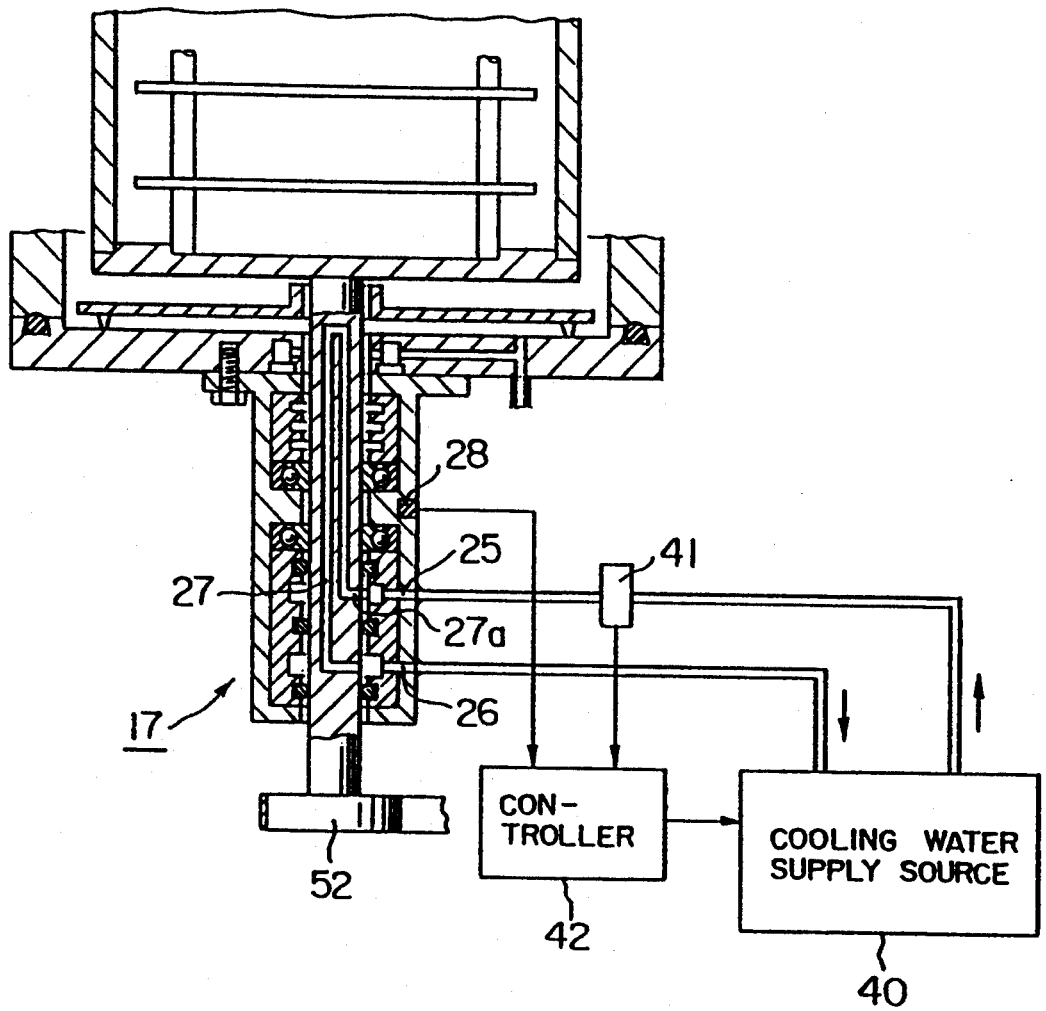
FIG. 3 is a block diagram of the control of a cooling water system of the rotary loading means of FIG. 2.

A cooling water supply source 40 for supplying water to and recovering water from the rotary loading means 17 is provided, as shown in FIG. 3. Cooling water of a set temperature at a set flow rate is provided. A flow rate meter 41 is provided at an outlet of the cooling water supply source 40. Further, a controller 42 is provided for processing flow rate data of the flow rate meter 41, and temperature data of the temperature sensor 28, and based on processed data of the controller 42, temperatures and flow rates of the cooling water supply source 40 are adjusted.

Next, the operation of the above described vertical heat treating apparatus 1 according to this invention will be explained.

As shown in FIG. 1, reaction gases, e.g., $NH_3$, $SiH_2Cl_2$, are fed into the reaction vessel 2 through the gas feed pipe 5. At this time, the reaction vessel 2 has been heated up to, e.g., 800° C., by the heater 7. While the reaction gases are being fed to form SiN films on the surfaces of respective semiconductor wafers W, the quartz boat 11 is turned by rotary motion of the rotary shaft 18 driven by the motor 51, thereby making the SiN films on the surfaces more homogeneous.

The reaction gases of a high temperature used in the treatment of the semiconductor wafers W are exhausted by exhaust means (not shown) through the exhaust pipe 6, to be exhausted outside the factory.

$N_2$ gas is fed through the $N_2$ gas inlet port 30 formed in the cap body 16 as shown in FIG. 2. This $N_2$ gas is discharged via the annular gas feed portions 31, so that corrosive gas, such as $SiH_2Cl_2$, is kept from intruding into the rotary shaft portion. Thus, corrosion of the rotary shaft 18 and the formation of films, such as $NH_4Cl$, can be prevented.

As shown in FIGS. 2 and 3, cooling water fed from the cooling water source 40 passes through the flow rate meter 41 and is fed into the circumferential groove 25a, which is in fluid communication with the cooling water inlet port 25. At this time, because the groove 25a is formed circumferential, even when the rotary shaft 18 is rotating, the cooling water can be supplied into the cooling water circulation passage 27. The cooling water then is exhausted into the circumferential groove 26a which is in fluid communication with the cooling water outlet port 26. The water is returned to the cooling water source 40 through the cooling water outlet port 26. The cooling water absorbs heat conducted from the heater 7 to the rotary shaft 18.

The flow rate of this cooling water is controlled based on temperature data from the temperature sensor 28 and flow rate data from the flow rate meter 41, whereby the flow rate and the temperature of the cooling water from the cooling water source 40 are controlled to retain the interior of the rotary loading means 17 at a set temperature, e.g., below 50° C.

In this control, for example, when the temperature sensor 28 detects a temperature of the interior of the rotary loading means 17 above a set temperature, the controller 42 supplies the cooling water supply source 40 with a control signal commanding the cooling water supply source 40 to increase the flow rate of the cooling water. In this manner, the temperature in the rotary loading means 17 can be lowered.

The oil 21 in the rotary loading means 17 of FIG. 2 has an abruptly decreased lifetime at temperatures above 50° C. The heat resistance temperature of the O-ring 23 in the rotary loading means 17 is below 200° C. Cooling the rotary shaft 18 prevents high-temperature heat from conducting to the magnetic seal 20 and the O-ring 23.

In the above-described embodiment, the cooling medium is water, but it may be fluid, liquid or gas. For example, a chiller may be used to cool the interior of the rotary loading means 17 down to −30° to +50° C. The cooling medium passage and the cooling agent are selected to obtain a required heat distribution for effective cooling.

This invention is not limited to the above-described embodiment and is applicable to any device, as long as the device requires cooling or heating of an air-tight sealing member for a rotary shaft.

As described above, this invention can provide the following advantageous effects:

According to this invention, a cooling medium is circulated in the rotary shaft of the rotary loading means to absorb heat from the rotary shaft, whereby the rotary shaft temperature can be lowered. That is, high temperature heat conducted to the rotary shaft can be absorbed by the cooling medium, and therefore, the rotary shaft does not have high temperatures.

Since the magnetic fluid sealing mechanism used in the rotation mechanism is not deteriorated by high temperature heat, air-tightness between the rotary shaft and the cap body can be maintained for a long time period.

According to this invention, the heat insulator holding the boat for heat treatment is supported by the rotary shaft with a cooling medium circulated in the circulation passage contained therein, whereby the rotary shaft, which is exposed to high temperature heat, can be cooled. Accordingly, the magnetic fluid seal mechanism is not deteriorated.

According to this invention, an inert gas is fed into the through-hole for the rotary shaft provided in the cap body, whereby the rotary shaft is kept from contact with reaction gases. Accordingly, corrosion of the rotary shaft with reaction gases can be prevented.

In accordance with the invention, either a heating medium or a cooling medium may be circulated through the rotary shaft. Water or ethylene glycol are examples of the heat exchange medium which may be circulated through the rotary shaft.

What is claimed is:

1. A vertical heat treating apparatus, comprising:
a cap body being movable up and down for sealing a treatment vessel for holding objects to be treated;
rotary loading means including a rotary shaft, said rotary loading means connected to the cap body, and a magnetic fluid seal member around the rotary shaft;
heat-exchange means provided in the rotating shaft for circulating a heat-exchange medium in the rotary shaft of the rotary loading means; and
a boat, for heat treatment, rotatably supported by the rotary shaft.

2. The vertical heat treating apparatus according to claim 1, wherein a through-hole for the rotary shaft is formed in the cap body.

3. The vertical heat treating apparatus according to claim 1, wherein the heat exchange medium is a cooling medium.

4. The vertical heat treating apparatus according to claim 1, wherein the heat exchange medium is a heating medium.

5. The vertical heat treating apparatus according to claim 1, wherein the heat exchange medium is water.

6. The vertical heat treating apparatus according to claim 1, wherein the heat exchange medium is ethylene glycol.

7. The vertical heat treating apparatus according to claim 1, wherein a temperature sensor is provided in the rotary loading means, wherein when a temperature above a set temperature is detected, a flow rate of the heat exchange medium is increased.

8. The vertical heat treating apparatus according to claim 2, wherein baffle plates are provided at a set interval above an upper surface of the cap body and opposed to the through-hole in the cap body.

9. The vertical heat treating apparatus according to claim 2, further including means for circulating nitrogen gas through the through-hole in the cap body.

10. The vertical heat treating apparatus according to claim 1, wherein a first circumferential groove is defined around the rotary shaft at an inlet for admitting the heat exchange medium into the rotary shaft.

11. The vertical heat treating apparatus according to claim 10, wherein a second circumferential groove is defined around the rotary shaft at an outlet for discharging the heat exchange medium from the rotary shaft.

12. The vertical heat treating apparatus according to claim 11, wherein an O-ring is provided between the first and second circumferential grooves.

13. The vertical heat treating apparatus according to claim 2, wherein a first circumferential groove is defined around the rotary shaft at an inlet for admitting the heat exchange medium into the rotary shaft.

14. The vertical heat treating apparatus according to claim 13, wherein a second circumferential groove is defined around the rotary shaft at an outlet for discharging the heat exchange medium from the rotary shaft.

15. The vertical heat treating apparatus according to claim 14, wherein an O-ring is provided between the first and second circumferential grooves.

16. The vertical heat treating apparatus according to claim 13, further including means for circulating nitrogen gas through the through-hole in the cap body.

17. The vertical heat treating apparatus according to claim 14, further including means for circulating nitrogen gas through the through-hole in the cap body.

18. The vertical heat treating apparatus according to claim 1, wherein the heat exchange medium is circulated in the rotary shaft above and below the level of the magnetic seal.

19. The vertical heat treating apparatus according to claim 13, wherein the heat exchange medium is circulated in the rotary shaft above and below the level of the magnetic seal.

20. The vertical heat treating apparatus according to claim 17, wherein the heat exchange medium is circulated in the rotary shaft above and below the level of the magnetic seal.

* * * * *